US009525053B2

(12) United States Patent
Hatcher et al.

(10) Patent No.: US 9,525,053 B2
(45) Date of Patent: Dec. 20, 2016

(54) INTEGRATED CIRCUIT DEVICES INCLUDING STRAINED CHANNEL REGIONS AND METHODS OF FORMING THE SAME

(71) Applicant: Samsung Electronics Co., Ltd., Suwon-si (KR)

(72) Inventors: Ryan M. Hatcher, Swarthmore, PA (US); Mark S. Rodder, Dallas, TX (US); Robert C. Bowen, Austin, TX (US); Jorge A. Kittl, Round Rock, TX (US)

(73) Assignee: Samsung Electronics Co., Ltd. (KR)

( * ) Notice: Subject to any disclaimer, the term of this patent is extended or adjusted under 35 U.S.C. 154(b) by 29 days.

(21) Appl. No.: 14/304,008

(22) Filed: Jun. 13, 2014

(65) Prior Publication Data

US 2015/0123075 A1    May 7, 2015

Related U.S. Application Data

(60) Provisional application No. 61/898,636, filed on Nov. 1, 2013.

(51) Int. Cl.
*H01L 29/04* (2006.01)
*H01L 29/778* (2006.01)
(Continued)

(52) U.S. Cl.
CPC ........ *H01L 29/7781* (2013.01); *H01L 29/122* (2013.01); *H01L 29/045* (2013.01);
(Continued)

(58) Field of Classification Search
CPC ........... H01L 21/823814; H01L 29/045; H01L 29/122; H01L 29/785
See application file for complete search history.

(56) References Cited

U.S. PATENT DOCUMENTS 6,646,322 B2   11/2003   Fitzgerald
6,649,480 B2   11/2003   Fitzgerald et al.
(Continued)

FOREIGN PATENT DOCUMENTS

WO   WO 2013/095656 A1   6/2013

OTHER PUBLICATIONS

Bowen et al., "Physical insight into reduced surface roughness scattering in strained silicon inversion layers", *Applied Physics Letters*, 2012, vol. 101, 073504, pp. 1-4.
(Continued)

*Primary Examiner* — Benjamin Sandvik
*Assistant Examiner* — Leslie Pilar Cruz
(74) *Attorney, Agent, or Firm* — Myers Bigel, P.A.

(57) ABSTRACT

Integrated circuit devices including strained channel regions and methods of forming the same are provided. The integrated circuit devices may include enhancement-mode field effect transistors. The enhancement-mode field effect transistors may include a quantum well channel region having a well thickness $T_w$ sufficient to yield a strain-induced splitting of a plurality of equivalent-type electron conduction states therein to respective unequal energy levels including a lowermost energy level associated with a lowermost surface roughness scattering adjacent a surface of the channel region when, the surface is biased into a state of inversion.

20 Claims, 5 Drawing Sheets

(51) Int. Cl.
*H01L 29/12* (2006.01)
*H01L 29/78* (2006.01)
*H01L 29/267* (2006.01)
*H01L 29/66* (2006.01)
*H01L 29/06* (2006.01)
*H01L 29/22* (2006.01)

(52) U.S. Cl.
CPC .......... *H01L 29/0657* (2013.01); *H01L 29/22* (2013.01); *H01L 29/267* (2013.01); *H01L 29/66431* (2013.01); *H01L 29/785* (2013.01)

(56) References Cited

U.S. PATENT DOCUMENTS

| | | | |
|---|---|---|---|
| 6,855,982 B1 | 2/2005 | Xiang et al. | |
| 7,098,057 B2 | 8/2006 | Chu et al. | |
| 7,432,149 B2 | 10/2008 | Wu et al. | |
| 7,485,506 B2 | 2/2009 | Doris et al. | |
| 7,569,442 B2 | 8/2009 | Ouyang et al. | |
| 7,608,857 B2 | 10/2009 | Fujimori et al. | |
| 7,674,667 B2 | 3/2010 | Zhu | |
| 7,763,505 B2 | 7/2010 | Gehring et al. | |
| 7,927,978 B2 | 4/2011 | Pfeiffer | |
| 8,026,534 B2 | 9/2011 | Langdo et al. | |
| 8,039,843 B2 | 10/2011 | Inaba | |
| 8,183,628 B2 | 5/2012 | Masuoka et al. | |
| 8,319,285 B2 | 11/2012 | Tilke et al. | |
| 8,349,668 B2 | 1/2013 | Moroz et al. | |
| 8,367,492 B2 | 2/2013 | Chidambarrao et al. | |
| 8,441,043 B2 | 5/2013 | Bangsaruntip et al. | |
| 8,445,892 B2 | 5/2013 | Cohen et al. | |
| 8,492,208 B1 | 7/2013 | Cohen et al. | |
| 8,501,577 B2 | 8/2013 | Bian et al. | |
| 2009/0236595 A1* | 9/2009 | Atanackovic | H01L 27/1207 257/43 |
| 2011/0175110 A1 | 7/2011 | Wada et al. | |
| 2013/0026451 A1 | 1/2013 | Bangsaruntip et al. | |
| 2013/0105763 A1 | 5/2013 | Yin et al. | |

OTHER PUBLICATIONS

Sakaki et al., "Interface roughness scattering in GaAs/AlAs quantum wells", *Applied Physics Letters*, 1987, vol. 51(23): 1934-1936.

Satpathy et al., "Electronic properties of the (100) (Si)/(Ge) strained-layer superlattices", *Physical Review B*, 1988, vol. 38(18): 13 237-13 245.

Valavanis et al., "Intersubband carrier scattering in n- and p-Si/SiGe quantum wells with diffuse interfaces", *Physical Review B*, 2008, vol. 77, pp. 1-7.

Ieong M. et al. "Silicon Device Scaling to the Sub-10-nm Regime", *Science*, vol. 306, Dec. 17, 2004, pp. 2057-2060.

* cited by examiner

INTEGRATED CIRCUIT DEVICES INCLUDING STRAINED CHANNEL REGIONS AND METHODS OF FORMING THE SAME

REFERENCE TO PRIORITY APPLICATION

This application is related to and claims the priority of U.S. Provisional Application Ser. No. 61/898,636, entitled CRYSTAL LAYER TUNING FOR SURFACE ROUGHNESS SCATTERING REDUCTION, filed in the USPTO on Nov. 1, 2013, the entire disclosure of which is incorporated herein by reference.

FIELD

The present disclosure generally relates to the field of electronics and, more particularly, integrated circuit devices.

BACKGROUND

Strained channel regions have been used to increase carrier mobility because strained channel regions lower the energy of conduction states therein. Lowering surface roughness scattering has been studied to further increase carrier mobility. Reduced surface roughness scattering in strained silicon inversion layers is investigated and disclosed, for example, in a paper by Chris Bowen and Ryan Hatcher entitled "Physical insight into reduced surface roughness scattering in strained silicon inversion layers", Applied Physics Letters 101, 073504 (2012), the disclosure of which is incorporated herein by reference in its entirety. Further, electronic properties of strained-layer superlattices are studied and disclosed, for example, in a paper by S. Satpathy et al. entitled "Electronic properties of the (100) (Si)/(Ge) strained-layer superlattices", Physical Review B, Volume 38, Number 18, pages 13237-13245, 15 Dec. 1988.

SUMMARY

An enhancement-mode field effect transistor may include a quantum well channel region having a well thickness $T_w$ sufficient to yield a strain-induced splitting of a plurality of equivalent-type electron conduction states therein to respective unequal energy levels including a lowermost energy level associated with a lowermost surface roughness scattering adjacent a surface of the channel region when the surface is biased into a state of inversion.

According to various embodiments, the well thickness $T_w$ may be equivalent to a thickness of the channel region as measured between an insulated gate electrode on the surface and a barrier layer having a bandgap greater than a bandgap of the channel region.

In various embodiments, the barrier layer may be lattice matched to the channel region at an interface therebetween.

In various embodiments, the barrier layer may include zinc sulfide (ZnS).

According to various embodiments, the transistor may be selected from a group consisting of ultrathin-body silicon-on-insulator (UTB-SOI) transistors and Fin-FETs.

In various embodiments, the channel region may include a material having degenerate conduction band minima states that are sufficiently spaced from a first Brillouin zone edge to form a plurality of hybridized conduction states due to quantization.

In various embodiments, the channel region may include silicon or $Si_xGe_{1-x}$ having a (100) crystal orientation, where x>0.15.

According to various embodiments, the well thickness $T_w$ may be defined by 27 or 34 crystal layers when the channel region includes silicon having a (100) crystal orientation.

In various embodiments, the channel region may include GaP having a (100) crystal orientation or carbon with a (100) diamond crystal orientation.

A Fin-FET may include a Fin-shaped semiconductor region including a barrier layer spine embedded therein, which is centered equidistant relative to first and second opposing sidewalls of the semiconductor region. The semiconductor region may have a width sufficient to yield a strain-induced splitting of a plurality of equivalent-type electron conduction states therein to respective unequal energy levels including a lowermost energy level associated with a lowermost surface roughness scattering adjacent the first and second opposing sidewalls of the semiconductor region when the first and second sidewalls are biased into a state of inversion.

According to various embodiments, the semiconductor region may include first and second quantum well channel regions on opposing sidewalls of the barrier layer. The barrier layer may have a bandgap greater than bandgaps of the first and second quantum well channel regions.

In various embodiments, the barrier layer may be lattice matched to the first and second channel regions at interfaces therebetween.

In various embodiments, the first and second channel regions may include silicon or $Si_xGe_{1-x}$ having a (100) crystal orientation, where x>0.15.

According to various embodiments, a well thickness $T_w$ may be equivalent to a width of the first channel region as measured between an insulated gate electrode on the first sidewall and the barrier layer. The well thickness $T_w$ may be defined by 27 or 34 crystal layers when the first channel region includes silicon having a (100) crystal orientation.

In various embodiments, the first and second channel regions may include GaP having a (100) crystal orientation or carbon with a (100) diamond crystal orientation.

According to various embodiments, the first and second channel regions may include a material having degenerate conduction band minima states that are sufficiently spaced from a first Brillouin zone edge to form a plurality of hybridized conduction states due to quantization.

A Fin-FET may include a Fin-shaped semiconductor region having a width sufficient to yield a strain-induced splitting of a plurality of equivalent-type electron conduction states therein to respective unequal energy levels including a lowermost energy level associated with a lowermost surface roughness scattering adjacent first and second opposing sidewalls of the semiconductor region when the first and second sidewalls are biased into a state of inversion.

According to various embodiments, the Fin-shaped semiconductor region may include first and second channel regions including the first and second opposing sidewalls, respectively. The first and second channel regions may include silicon or $Si_xGe_{1-x}$ having a (100) crystal orientation, where x>0.15.

In various embodiments, a width of the first channel region may be defined by 27 or 34 crystal layers when the first channel region includes silicon having a (100) crystal orientation.

In various embodiments, the Fin-shaped semiconductor region may include first and second channel regions including the first and second opposing sidewalls, respectively. The first and second channel regions may include GaP having a (100) crystal orientation or carbon with a (100) diamond crystal orientation.

DETAILED DESCRIPTION

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments of the inventive concept are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, example embodiments of the inventive concept should not be construed as limited to the particular shapes illustrated herein but include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

It should also be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the present inventive concept.

A field-effect transistors according to some embodiments of the present inventive concept includes a quantum well channel region having a well thickness sufficient to yield a strain-induced splitting of a plurality of equivalent-type electron conduction states therein to respective unequal energy levels including a lowermost energy level associated with a lowermost surface roughness scattering adjacent a surface of the channel region when the surface is biased into a state of inversion.

Figure 1:
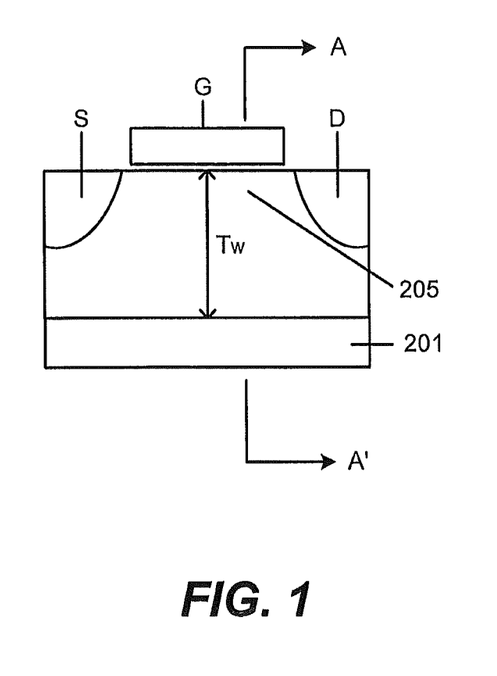
FIG. 1 is a diagram illustrating a field-effect transistor (FET) according to some embodiments of the present inventive concept.

FIG. 1 is a diagram illustrating a field-effect transistor (FET) according to some embodiments of the present inventive concept. Referring to FIG. 1, the transistors include a barrier layer 201 and a quantum well channel region 205. The transistors also include source and drain regions and an insulated gate on the quantum well channel region 205. The barrier layer may have a bandgap greater than a bandgap of the quantum well channel region 205, and the quantum well channel region 205 has a specific well thickness $T_w$ including a specific number of crystal planes.

The specific well thickness $T_w$ is a well thickness sufficient to yield a strain-induced splitting of a plurality of equivalent-type electron conduction states therein to respective unequal energy levels including a lowermost energy level associated with a lowermost surface roughness scattering adjacent a surface of the channel region when the surface is biased into a state of inversion.

Figure 2:
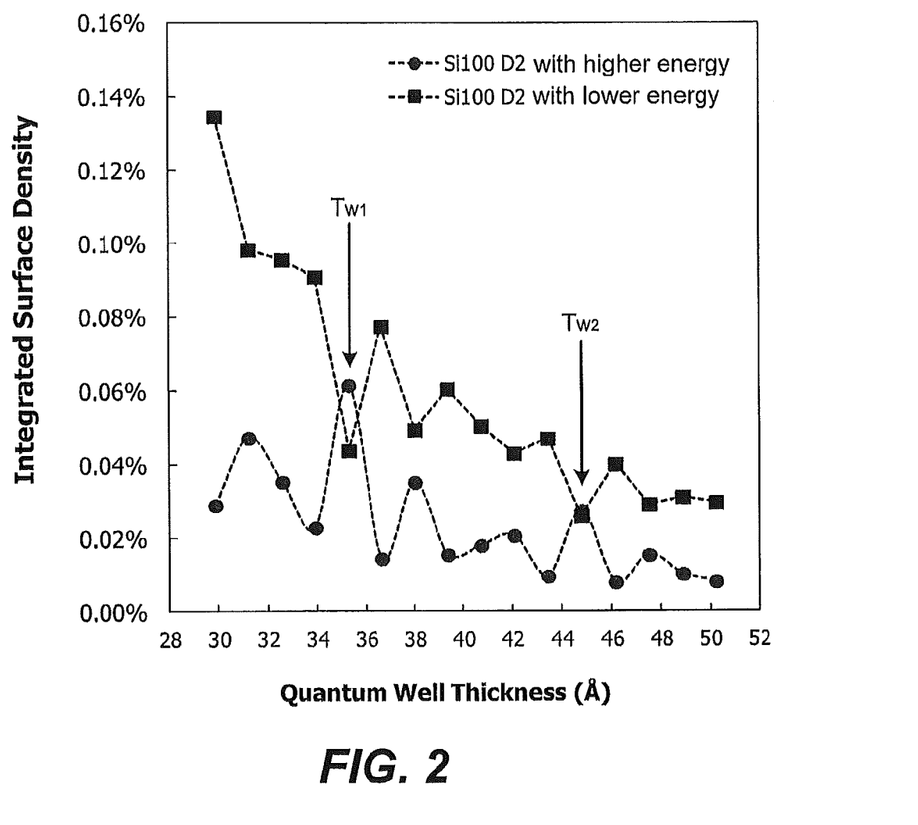
FIG. 2 is a graph illustrating a relationship between quantum well thickness and integrated surface density of a Si layer having a (100) crystal orientation.

FIG. 2 is a graph illustrating a relationship between quantum well thickness and integrated surface density of Si layer having a (100) crystal orientation. Referring to FIG. 2, for the majority of well thicknesses, the D2 state with lower energy has higher integrated surface density and the D2 state with higher energy has lower surface integrated density. However, the D2 state with lower energy has lower integrated surface density relative to the D2 state with higher energy at specific quantum well thicknesses $T_{w1}$ and $T_{w2}$. Accordingly, carriers preferentially occupy the D2 state with lower surface density when the quantum well channel region 205 has one of the specific thicknesses $T_{w1}$ and $T_{w2}$ and there thus will be additional reduction in SRS. The specific quantum well thicknesses $T_{W1}$ and $T_{W2}$ correspond to 27 or 34 crystal layers, respectively.

Figure 3:
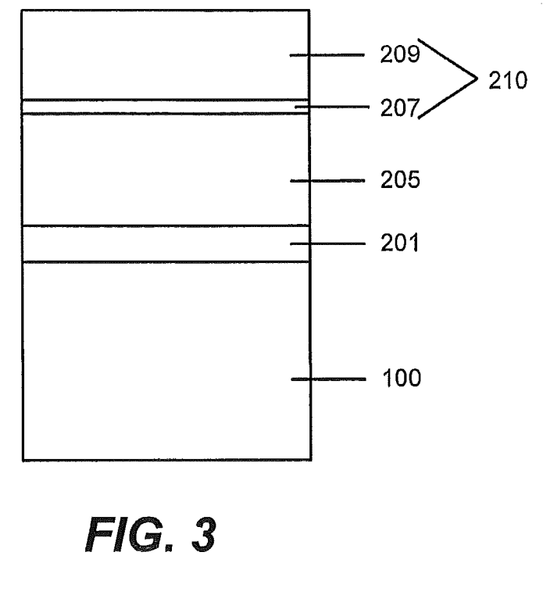
FIG. 3 is a cross-sectional view taken along line A-A' of FIG. 1.

FIG. 3 is a cross-sectional view taken along the line A-A' of FIG. 1. Referring to FIG. 3, a barrier layer 201, a quantum well channel region 205 and a gate stack 210 may be sequentially disposed on a substrate 100. The gate stack 210 may include a gate insulating layer 207 and a gate electrode 209. The well thickness $T_w$ is equivalent to a thickness of the quantum well channel region 205 as measured between the gate stack 210 on the surface and the barrier layer 201.

The substrate 100 may include one or more semiconductor materials selected from the group consisting of Si, Ge, SiGe, GaP, GaAs, SiC, SiGeC, InAs and InP. The substrate 100 may be, for example, a bulk silicon substrate or a SOI substrate.

The barrier layer 201 may have a bandgap greater than a bandgap of the channel region 205 and, for example, may include ZnS. The barrier layer 201 may be lattice matched to the channel region 205 at an interface therebetween.

The channel region 205 may include material and orientation with two or more conduction states that hybridize when confined in one or more directions, for example, quantum wells or nanowires. Specifically, the channel region 205 may include material and crystal orientation satisfying following conditions: 1) degenerate conduction band minima, 2) degenerate states having a reflection symmetry across a plane that is parallel to the surface of the quantum well and crosses the origin, and 3) the degenerate conduction band minima states sufficiently far enough from the first Brillouin zone edge to form two hybridized states due to quantization.

For example, the channel region 205 may include silicon or $Si_xGe_{1-x}$ having a (100) crystal orientation and x>0.15. In some embodiments, the channel region 205 may include GaP having a (100) crystal orientation or carbon having a (100) diamond crystal orientation. In some embodiments, the channel region 205 comprises silicon having a (100) crystal orientation and the well thickness $T_w$ is defined by 27 or 34 crystal layers. To form a specific number of crystal layers included in the channel region 205, an Atomic Layer Deposition (ALD) process may be used.

Figure 4:
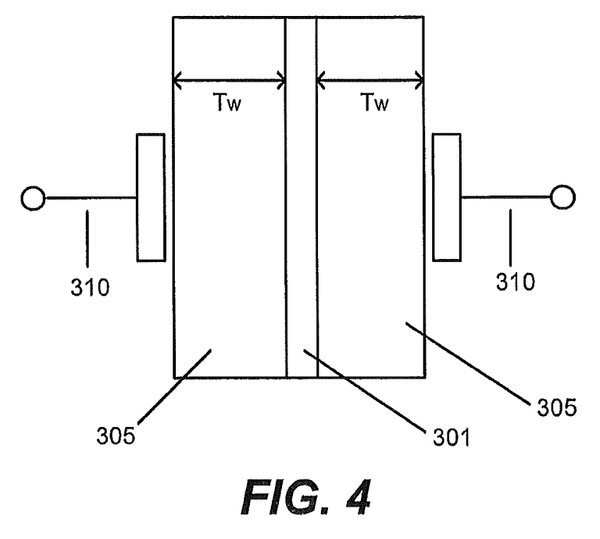
FIG. 4 is a diagram illustrating a Fin-FET device according to some embodiments of the present inventive concept.

FIG. 4 is a diagram illustrating a Fin-FET device according to some embodiments of the present inventive concept. Referring to FIG. 4, a quantum well channel region 305 and a gate stack 310 are sequentially disposed on a barrier layer 301. It will be understood that the quantum well channel region 305 and the gate stack 310 can be disposed only one side of the barrier layer 301. It will be further understood that two quantum well channel regions 305 may be electrically connected each other.

The quantum well channel region 305 disposed on the barrier layer 301 has a specific well thickness $T_w$ including a specific number of crystal planes to yield a strain-induced splitting of a plurality of equivalent-type electron conduction states therein to respective unequal energy levels including a lowermost energy level associated with a lowermost surface roughness scattering adjacent first and second opposing sidewalls of the semiconductor region when the first and second sidewalls are biased into a state of inversion. The well thickness $T_w$ is equivalent to a thickness of the quantum well channel region 305 as measured between the gate structure 310 and the barrier layer 301.

The barrier layer 301 may have a bandgap greater than a bandgap of the channel region 305 and, for example, may include ZnS. The barrier layer 301 may be lattice matched to the channel region 305 at an interface therebetween.

The channel region 305 may include material and crystal orientation satisfying following conditions: 1) degenerate conduction band minima, 2) degenerate states having a reflection symmetry across a plane that is parallel to the surface of the quantum well and crosses the origin, and 3) the degenerate conduction band minima states sufficiently far enough from the first Brillouin zone edge to form two hybridized states due to quantization.

For example, the channel region 305 may include silicon or $Si_xGe_{1-x}$ having a (100) crystal orientation and x>0.15. In some embodiments, the channel region 305 may include GaP having a (100) crystal orientation or carbon having a (100) diamond crystal orientation. In some embodiments, the channel region 305 comprises silicon having a (100) crystal orientation and the well thickness $T_w$ is defined by 27 or 34 crystal layers. To form a specific number of crystal layers included in the channel region 305, an Atomic Layer Deposition (ALD) process may be used.

Figure 5:
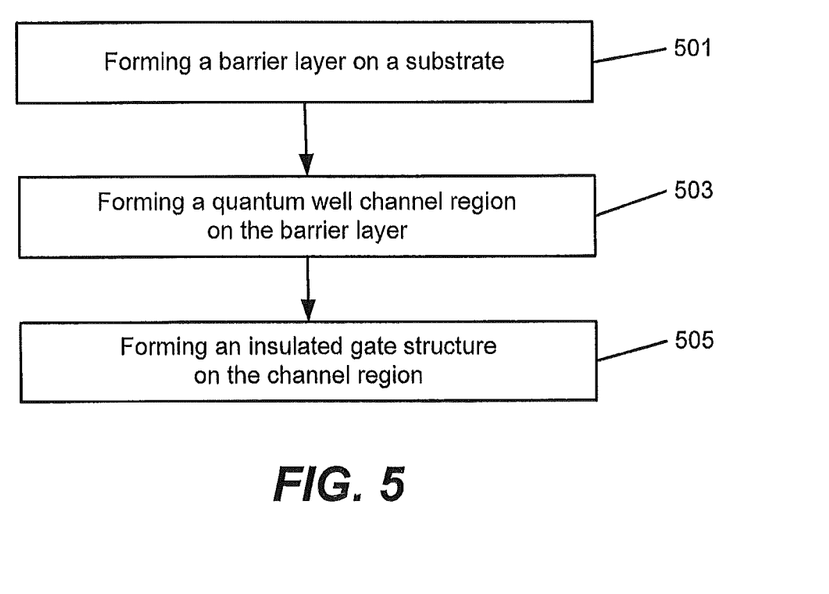
FIG. 5 is a flow diagram illustrating methods of fabricating a MOSFET according to some embodiments of the present inventive concept.

FIG. 5 is a flow diagram illustrating methods of fabricating a field effect transistor according to some embodiments of the present inventive concept. Referring to FIG. 5, a barrier layer may be formed on a substrate (Block 501). A quantum well channel region may be formed on at least one surface of the barrier layer (Block 503). The barrier layer has a bandgap greater than a bandgap of the channel region. The channel region has a thickness $T_w$ sufficient to yield a strain-induced splitting of a plurality of equivalent-type electron conduction states therein to respective unequal energy levels including a lowermost energy level associated with a lowermost surface roughness scattering adjacent a surface of the channel region when the surface is biased into a state of inversion. The channel region may be formed using an ALD processes. An insulated gate structure is formed on the channel region (Block 505).

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed:
1. An enhancement-mode field effect transistor, comprising:
a quantum well channel region having a well thickness $T_w$ sufficient to yield a strain induced splitting of a plurality of equivalent electron conduction states therein to respective unequal energy levels including a lowermost energy level associated with a lowermost surface roughness scattering adjacent a surface of the channel region when the surface is biased into a state of inversion.

2. The transistor of claim 1, wherein the well thickness $T_w$ is equivalent to a thickness of the channel region as measured between an insulated gate electrode on the surface and a barrier layer having a bandgap greater than a bandgap of the channel region.

3. The transistor of claim 2, wherein the barrier layer is lattice matched to the channel region at an interface therebetween.

4. The transistor of claim 2, wherein the barrier layer comprises zinc sulfide (ZnS).

5. The transistor of claim 1, wherein the transistor is selected from a group consisting of ultrathin-body silicon-on-insulator (UTB-SOI) transistors and Fin-FETs.

6. The transistor of claim 1, wherein the channel region comprises a material having degenerate conduction band minima states that are sufficiently spaced from a first Brillouin zone edge to form a plurality of hybridized conduction states due to quantization.

7. The transistor of claim 1, wherein the channel region comprises silicon or $Si_xGe_{1-x}$ having a (100) crystal orientation, where x>0.15.

8. The transistor of claim 7, wherein the well thickness $T_w$ is defined by 27 or 34 crystal layers when the channel region comprises silicon having a (100) crystal orientation.

9. The transistor of claim 1, wherein the channel region comprises GaP having a (100) crystal orientation or carbon with a (100) diamond crystal orientation.

10. A Fin-FET, comprising:
a Fin-shaped semiconductor region comprising a barrier layer spine embedded therein, which is centered equidistant relative to first and second opposing sidewalls of the semiconductor region, said semiconductor region having a width sufficient to yield a strain induced splitting of a plurality of equivalent electron conduction states therein to respective unequal energy levels including a lowermost energy level associated with a lowermost surface roughness scattering adjacent the first and second opposing sidewalls of the semiconductor region when the first and second sidewalls are biased into a state of inversion.

11. The transistor of claim 10, wherein:
said semiconductor region comprises first and second quantum well channel regions on opposing sidewalls of the barrier layer; and
the barrier layer has a bandgap greater than bandgaps of the first and second quantum well channel regions.

12. The transistor of claim 11, wherein the barrier layer is lattice matched to the first and second channel regions at interfaces therebetween.

13. The transistor of claim 11, wherein the first and second channel regions comprise silicon or $Si_xGe_{1-x}$ having a (100) crystal orientation, where x>0.15.

14. The transistor of claim 13, wherein:
a well thickness $T_w$ is equivalent to a width of the first channel region as measured between an insulated gate electrode on the first sidewall and the barrier layer; and
the well thickness $T_w$ is defined by 27 or 34 crystal layers when the first channel region comprises silicon having a (100) crystal orientation.

15. The transistor of claim 11, wherein the first and second channel regions comprise GaP having a (100) crystal orientation or carbon with a (100) diamond crystal orientation.

16. The transistor of claim 11, wherein the first and second channel regions comprise a material having degenerate conduction band minima states that are sufficiently spaced from a first Brillouin zone edge to form a plurality of hybridized conduction states due to quantization.

17. A Fin-FET, comprising:
a Fin-shaped semiconductor region having a width sufficient to yield a strain-induced splitting of a plurality of equivalent electron conduction states therein to respective unequal energy levels including a lowermost energy level associated with a lowermost surface roughness scattering adjacent first and second opposing sidewalls of the semiconductor region when the first and second sidewalls are biased into a state of inversion.

18. The transistor of claim 17, wherein:
said Fin-shaped semiconductor region comprises first and second channel regions comprising the first and second opposing sidewalls, respectively; and
the first and second channel regions comprise silicon or $Si_xGe_{1-x}$ having a (100) crystal orientation, where x>0.15.

19. The transistor of claim 18, wherein a width of the first channel region is defined by 27 or 34 crystal layers when the first channel region comprises silicon having a (100) crystal orientation.

20. The transistor of claim 17, wherein:
said Fin-shaped semiconductor region comprises first and second channel regions comprising the first and second opposing sidewalls, respectively; and
the first and second channel regions comprise GaP having a (100) crystal orientation or carbon with a (100) diamond crystal orientation.

* * * * *